US010639676B2

(12) United States Patent
Kagayama et al.

(10) Patent No.: US 10,639,676 B2

(45) Date of Patent: May 5, 2020

(54) VIBRATION DEVICE

(71) Applicant: Murata Manufacturing Co., Ltd., Nagaokakyo-shi, Kyoto-fu (JP)

(72) Inventors: Kenji Kagayama, Nagaokakyo (JP); Daizo Ito, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 793 days.

(21) Appl. No.: 15/293,597

(22) Filed: Oct. 14, 2016

(65) Prior Publication Data

US 2017/0028441 A1 Feb. 2, 2017

Related U.S. Application Data

(63) Continuation of application No. PCT/JP2015/061244, filed on Apr. 10, 2015.

(30) Foreign Application Priority Data

Apr. 24, 2014 (JP) ................................ 2014-090337
Oct. 24, 2014 (JP) ................................ 2014-217204

(51) Int. Cl.
*H01L 41/09* (2006.01)
*B06B 1/06* (2006.01)

(52) U.S. Cl.
CPC .......... *B06B 1/0644* (2013.01); *B06B 1/0603* (2013.01); *H01L 41/09* (2013.01)

(58) Field of Classification Search
CPC .............................. H01L 41/09; B06B 1/0644
See application file for complete search history.

(56) References Cited

U.S. PATENT DOCUMENTS

| | | | | |
|---|---|---|---|---|
| 8,247,954 | B2 | 8/2012 | Kagayama et al. | |
| 8,513,858 | B2 * | 8/2013 | Kagayama ............ | B06B 1/0603 310/328 |
| 2011/0095649 | A1 | 4/2011 | Kagayama et al. | |
| 2011/0140574 | A1 | 6/2011 | Kagayama et al. | |
| 2018/0131346 | A1 * | 5/2018 | Kagayama ............ | H01L 41/094 |

FOREIGN PATENT DOCUMENTS

| | | | |
|---|---|---|---|
| JP | H10-210766 | A | 8/1998 |
| JP | H10-337533 | A | 12/1998 |
| JP | H11-313395 | A | 11/1999 |
| JP | 2002-159917 | A | 6/2002 |
| WO | WO 2009/141970 | A1 | 11/2009 |
| WO | WO 2010/023801 | A1 | 3/2010 |

OTHER PUBLICATIONS

International Search Report issued for PCT/JP2015/061244, dated Jun. 30, 2015.

Written Opinion of the International Searching Authority issued for PCT/JP2015/061244, dated Jun. 30, 2015.

* cited by examiner

*Primary Examiner* — Thomas M Dougherty
*Assistant Examiner* — Karen B Addison
(74) *Attorney, Agent, or Firm* — Arent Fox LLP

(57) ABSTRACT

A vibration device that includes an elastic plate having a first elastic plate section, a second elastic plate section opposing the first elastic plate section, and a curvature joining section connecting the first and second elastic plate sections; a piezoelectric vibration element is provided on a surface of the first elastic plate section; and a circuit is provided on the second elastic plate section. A mass addition member is attached to a leading end portion of the first elastic plate section, and the elastic plate is accommodated in a package member.

19 Claims, 10 Drawing Sheets

14
1
14a
14c
14b
2c
9
2

VIBRATION DEVICE

CROSS REFERENCE TO RELATED APPLICATIONS

The present application is a continuation of International application No. PCT/JP2015/061244, filed Apr. 10, 2015, which claims priority to Japanese Patent Application No. 2014-090337, filed Apr. 24, 2014, and Japanese Patent Application No. 2014-217204, filed Oct. 24, 2014, the entire contents of each of which are incorporated herein by reference.

FIELD OF THE INVENTION

The present invention relates to a vibration device in which a piezoelectric vibration element is fixed to an elastic plate such as a metal plate or the like.

BACKGROUND OF THE INVENTION

As a vibration device that is used to report arrival of an e-mail or the like with vibrations, various types of vibration devices have been proposed. An example of such vibration device is disclosed in Patent Document 1 cited below. In the vibration device disclosed in Patent Document 1, in order to miniaturize and thin the device, there is formed an elastic plate by bending a metal plate so as to have a U shape when viewed from a lateral side. One side of the stated elastic plate serves as a plate-like fixation section and the other side thereof serves as a plate-like vibration section with a bending section interposed therebetween. A piezoelectric vibration plate is provided on the vibration section.

Further, in Patent Document 1, there is disclosed a driving device in which a driver circuit for driving the piezoelectric vibration plate is provided on a flexible printed circuit board. The stated flexible printed circuit board is fixed onto an outer side portion surface of the above-mentioned fixation section.

Patent Document 1: International Publication No. WO 2010/023801 A1

SUMMARY OF THE INVENTION

This type of vibration device has been required to be further miniaturized and thinned as electronic apparatuses and the like are miniaturized and the components mounted thereon are also miniaturized for highly sophisticated functions.

An object of the present invention is to provide a vibration device having been further thinned and miniaturized.

A vibration device according to the present invention includes an elastic plate having a first elastic plate section, a second elastic plate section that is opposed to and spaced from the first elastic plate section, and a joining section connecting the first elastic plate section and the second elastic plate section; a piezoelectric vibration element is provided on a surface of the first elastic plate section on the second elastic plate section side thereof; a circuit for driving the piezoelectric vibration element is provided on a surface of the second elastic plate section on the first elastic plate section side thereof; a mass addition member is attached to a leading end portion of the first elastic plate section; and a package member is provided to accommodate the elastic plate to which the piezoelectric vibration element, the circuit, and the mass addition member are attached.

In a first aspect of the vibration device according to the present invention, the mass addition member is constituted of a substantially plate-like body including a first main surface positioned on the first elastic plate section side and a second main surface positioned on the second elastic plate section side, and a slanted surface portion is provided on the second main surface so that a thickness of the mass addition member decreases as a distance from the leading end portion of the first elastic plate section increases. In this case, the mass addition member is unlikely to bump against the second elastic plate section, which makes it possible to allow the amplitude to be large. Accordingly, an amount of displacement of the first elastic plate section can be increased.

In a second aspect of the vibration device according to the present invention, the first main surface of the mass addition member has a first planar surface portion and a second planar surface portion that is positioned on the second main surface side relative to the first planar surface portion, a step is provided between the first planar surface portion and the second planar surface portion, a height of the step is the same as a thickness of the first elastic plate section, and the leading end portion of the first elastic plate section is provided on the second planar surface portion. In this case, the vibration device can be further thinned.

In a certain specific aspect of the second aspect of the vibration device according to the present invention, a third planar surface portion is provided on the first main surface of the mass addition member while being positioned on the second main surface side relative to the second planar surface portion with a step interposed between the second planar surface portion and the third planar surface portion, and a height of the step between the second planar surface portion and the third planar surface portion is equal to or greater than a thickness of the piezoelectric vibration element. In this case, the vibration device can be furthermore thinned.

In another specific aspect of the second aspect of the vibration device according to the present invention, the piezoelectric vibration element is spaced from the third planar surface portion with a gap interposed therebetween. In this case, vibrations of the piezoelectric vibration element are unlikely to be disturbed by the mass addition member.

In a third aspect of the vibration device according to the present invention, the elastic plate is made of a single metal plate having been bent. In this case, the elastic plate can be obtained with ease.

In a fourth aspect of the vibration device according to the present invention, the package member includes a top plate portion that is so arranged as to oppose the first elastic plate section. In this case, strength of the vibration device can be raised.

In a certain specific aspect of the fourth aspect of the vibration device according to the present invention, the top plate portion of the package member covers the first main surface of the mass addition member, and an inner surface of the top plate portion acts as a stopper that defines a termination point of displacement of a leading end portion of the mass addition member toward the package member side when the elastic plate vibrates. In this case, an excessive amount of displacement of the first elastic plate section can be suppressed.

In another specific aspect of the fourth aspect of the vibration device according to the present invention, in the case where a direction in which the first and second elastic plate sections extend from the joining section is taken as a lengthwise direction, the top plate portion of the package member has an edge positioned on the mass addition member side in the lengthwise direction relative to the joining section side, and the package member includes a locking wall extending from the stated edge of the top plate portion toward the second elastic plate section. In this case, the displacement of the first elastic plate section is suppressed, and tensile stress is unlikely to be applied to the piezoelectric vibration element. Therefore, a crack is unlikely to be generated in the piezoelectric vibration element.

In still another specific aspect of the fourth aspect of the vibration device according to the present invention, the top plate portion has first and second side edges, the package member includes first and second side surface portions extending from the first and second side edges of the top plate portion toward the second elastic plate section side, the second elastic plate section is fixed to the first and second side surface portions, and the second elastic plate section constitutes a bottom plate portion of the vibration device. In this case, the second elastic plate section functions as a bottom plate of the package member.

In further another specific aspect of the fourth aspect of the vibration device according to the present invention, the locking wall of the package member is fixed to the bottom plate portion. In this case, the displacement of the first elastic plate section is more surely suppressed, and tensile stress is further unlikely to be applied to the piezoelectric vibration element.

In still another specific aspect of the fourth aspect of the vibration device according to the present invention, the locking wall is fixed to the bottom plate portion by welding. In this case, the displacement of the first elastic plate section is further suppressed with certainty, and the tensile stress is further unlikely to be applied to the piezoelectric vibration element.

In still another specific aspect of the fourth aspect of the vibration device according to the present invention, in the case where a direction in which the first and second elastic plate sections extend from the joining section is taken as the lengthwise direction, a dimension of the second elastic plate section in the lengthwise direction is longer than that of the first elastic plate section in the lengthwise direction. In this case, the second elastic plate section sufficiently functions as the bottom plate of the package member.

In still another specific aspect of the fourth aspect of the vibration device according to the present invention, the second elastic plate section extends to a position opposing the mass addition member so as to define a termination point of the displacement of the mass addition member toward the second elastic plate section side when the elastic plate vibrates. In this case, breakage or the like of the piezoelectric vibration element is unlikely to occur because a flexure of the first elastic plate section can be regulated.

In still another specific aspect of the fourth aspect of the vibration device according to the present invention, a direction in which the first and second elastic plate sections extend from the joining section is taken as the lengthwise direction, and a projecting portion of the second elastic plate section is provided in a direction parallel to a surface of the second elastic plate section on the first elastic plate section side and orthogonal to the lengthwise direction; a cutout is provided in a lower end surface of each of the first and second side surface portions of the package member; and the projecting portion is arranged within the cutout. In this case, positioning of the elastic plate can be easily carried out with respect to the package member.

In still another specific aspect of the fourth aspect of the vibration device according to the present invention, the second elastic plate section is fixed to the first and second side surface portions of the package member by welding. In this case, the elastic plate can be firmly fixed to the package member. This makes it possible to suppress vibrations of the second elastic plate section and cause the first elastic plate section to vibrate more effectively.

In a fifth aspect of the vibration device according to the present invention, a direction in which the first and second elastic plate sections extend from the joining section is taken as the lengthwise direction, a direction in which the first and second elastic plate sections oppose each other is taken as a thickness direction, an axis that extends in the lengthwise direction and passes through the center in the thickness direction between a surface of the first elastic plate section on the opposite side to the second elastic plate section side and a surface of the piezoelectric vibration element on the second elastic plate section side is taken as a central axis, and the center of gravity of the mass addition member is positioned on the second elastic plate section side relative to the central axis. In this case, not a tensile stress but a compression stress is applied to the piezoelectric vibration element. Because of this, a crack is unlikely to be generated in the piezoelectric vibration element.

In a sixth aspect of the vibration device according to the present invention, the piezoelectric vibration element is a laminated-type piezoelectric vibration element including a piezoelectric body layer and a plurality of inner electrodes that are laminated with the piezoelectric body layer interposed between the inner electrodes.

In a seventh aspect of the vibration device according to the present invention, an electric connection member connecting the piezoelectric vibration element and the above-mentioned circuit section is further provided.

In a certain specific aspect of the seventh aspect of the vibration device according to the present invention, the circuit section includes a flexible printed circuit board, the electric connection member is provided being integrated with the flexible printed circuit board, and the electric connection member is extended to the first elastic plate portion through an inner side portion of the joining section so as to be electrically connected to the piezoelectric vibration element. In this case, the piezoelectric vibration element and the circuit section can be electrically connected with ease. In addition, since the flexible printed circuit board is excellent in flexibility, the vibrations of the elastic plate are unlikely to be disturbed thereby.

In another specific aspect of the seventh aspect of the vibration device according to the present invention, the piezoelectric vibration element includes a first main surface and a second main surface, the piezoelectric vibration element is fixed to the first elastic plate section with the first main surface side of the piezoelectric vibration element, first and second electrodes to be electrically connected to the exterior are provided on the second main surface of the piezoelectric vibration element, and the electric connection member is electrically connected to the first and second electrodes. In this case, the electric connection member can be easily connected to the piezoelectric vibration element.

According to the present invention, because a piezoelectric vibration element is provided on a surface of the first elastic plate section on the second elastic plate section side while a circuit section is provided on a surface of the second elastic plate section on the first elastic plate section side, the vibration device can be miniaturized, and particularly can be thinned.

DETAILED DESCRIPTION OF THE PREFERRED EMBODIMENTS

Hereinafter, the present invention will be clarified through description of specific embodiments of the present invention with reference to the drawings.

It is to be noted that the embodiments described in this specification are merely examples, and configurations described in the embodiments can replace each other or be combined as well.

Figure 1:
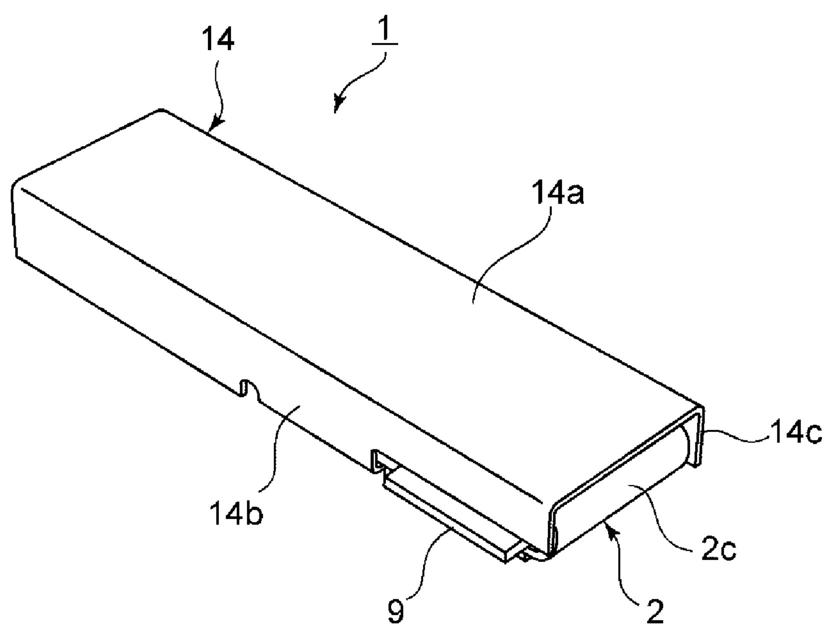
FIG. 1 is a perspective view illustrating an external appearance of a vibration device according to a first embodiment of the present invention.
Figure 2:
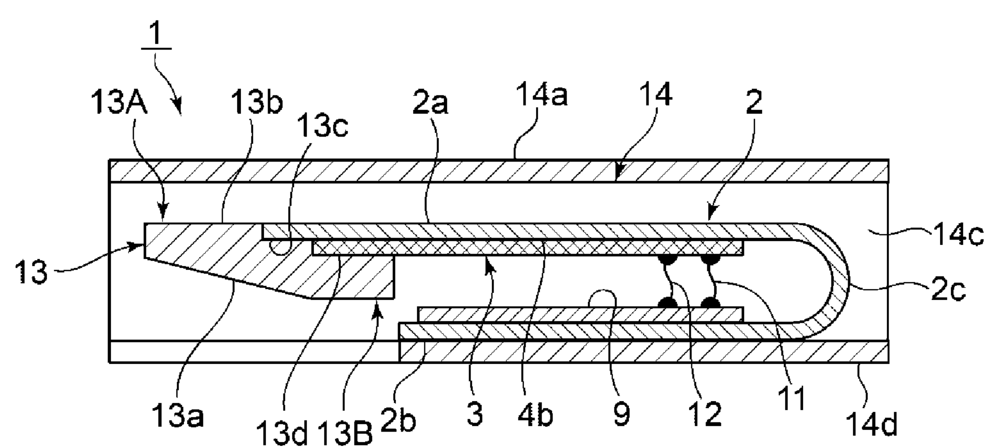
FIG. 2 is a cross-sectional side view of the vibration device according to the first embodiment of the present invention.
Figure 3:
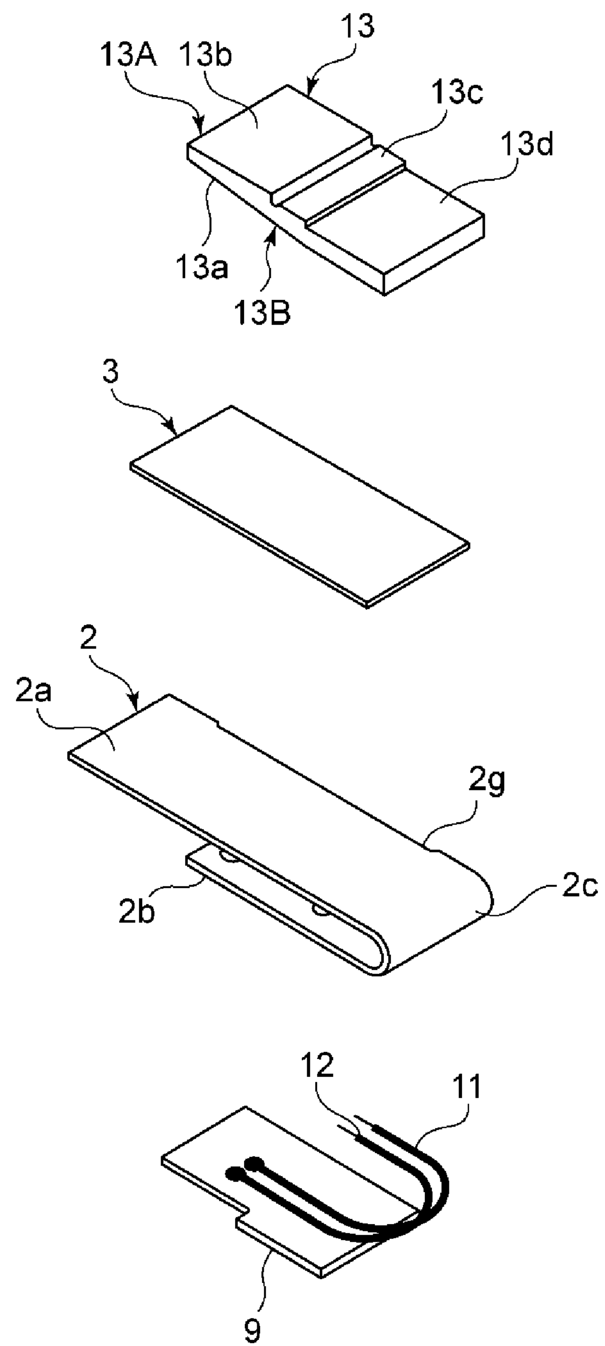
FIG. 3 is an exploded perspective view illustrating structures of constituent elements, excluding a package member, of the vibration device according to the first embodiment of the present invention.

FIG. 1 is a perspective view illustrating an external appearance of a vibration device according to a first embodiment of the present invention, and FIG. 2 is a cross-sectional side view thereof. FIG. 3 is an exploded perspective view for explaining major constituent elements of the vibration device according to the present embodiment.

A vibration device 1 can be used for realizing a notification function with vibrations or the like in a mobile electronic apparatus. As shown in FIGS. 1 through 3, the vibration device 1 includes an elastic plate 2. The elastic plate 2 is made of an appropriate elastic material. As such material, a metal, a synthetic resin, or the like can be used. In particular, a metal such as stainless steel or the like is preferable. Using the above preferable material makes it possible to lessen a mechanical loss of vibrations in the elastic plate 2.

The elastic plate 2 has a first elastic plate section 2*a*, and a second elastic plate section 2*b* that is so arranged as to oppose the first elastic plate section 2*a*. Although not limited to any specific shape, the first elastic plate section 2*a* and the second elastic plate section 2*b* are each formed in a rectangular plate-like shape.

The first elastic plate section 2*a* and the second elastic plate section 2*b* are connected through a curvature joining section 2*c* as a joining section. In the present embodiment, the curvature joining section 2*c* is, as shown in FIG. 2, formed in a U shape in side view. The elastic plate 2 is made of a single metal having been bent. The shape of the joining section is not limited to a U shape, and may be a square shape with one side open, for example.

A piezoelectric vibration element 3 is provided on an inner surface of the first elastic plate section 2*a*, that is, a surface opposing the second elastic plate section 2*b*. The piezoelectric vibration element 3 is fixed to the first elastic plate section 2*a* using an appropriate adhesive such as a thermosetting resin-based adhesive or the like. The piezoelectric vibration element 3 has a rectangular plate-like shape. Although FIGS. 2 and 3 schematically illustrate the piezoelectric vibration element 3, details thereof will be described with reference to FIG. 4 and FIG. 5.

Figure 4:
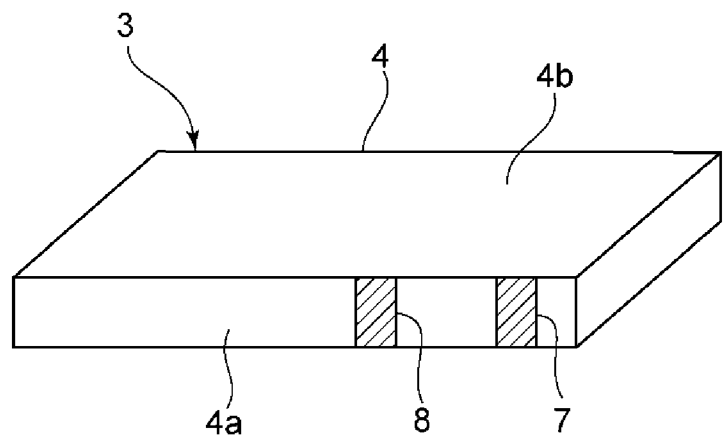
FIG. 4 is a perspective view illustrating a laminated-type piezoelectric vibration element used in the vibration device according to the first embodiment of the present invention.
Figure 5A:
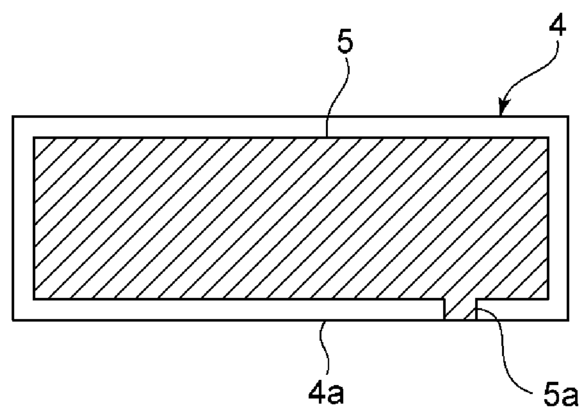
FIG. 5(*a*) and FIG. 5(*b*) are schematic cross-sectional plan views each illustrating a planar shape of an excitation electrode provided inside a laminated-type piezoelectric vibration element.
Figure 5B:
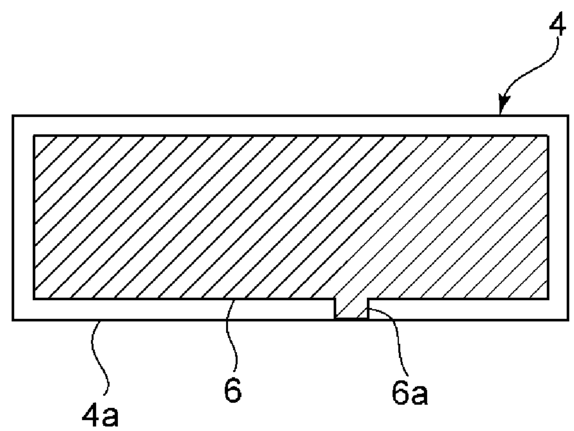

As shown in FIG. 4, the piezoelectric vibration element 3 includes a ceramic multilayer body 4 having a plurality of piezoelectric ceramic layers. Inside the ceramic multilayer body 4, a plurality of inner electrodes are laminated with the piezoelectric ceramic layers as piezoelectric body layers being interposed between the inner electrodes. To be more specific, in the present embodiment, a plurality of first inner electrodes 5 shown in FIG. 5(*a*) and a plurality of second inner electrodes 6 shown in FIG. 5(*b*) are alternately laminated. Note that, it is sufficient that at least one or more layers of the first inner electrodes 5 and at least one or more layers of the second inner electrodes 6 are laminated.

The first inner electrode 5 includes an extended portion 5*a* extended to a side surface 4*a* of the ceramic multilayer body 4. The second inner electrode 6 includes an extended portion 6*a*. The extended portion 6*a* is also extended to the side surface 4*a*. As shown in FIG. 4, first and second outer electrodes 7 and 8 are provided on the side surface 4*a* of the ceramic multilayer body 4. The extended portions 5*a* and 6*a* are connected to the first and second outer electrodes 7 and 8, respectively.

The piezoelectric vibration element 3 is a laminated-type piezoelectric vibration element including the plurality of inner electrodes 5 and the plurality of inner electrodes 6. The piezoelectric vibration element 3 expands/contracts in an in-plane direction when an AC electric field being applied between the first and second outer electrodes 7 and 8.

As a material for forming the ceramic multilayer body 4, appropriate piezoelectric ceramics such as PZT-based ceramics can be used. The first and second inner electrodes 5 and 6 and the first and second outer electrodes 7 and 8 are each made of an appropriate metal or alloy.

The piezoelectric vibration element 3 is pasted to the first elastic plate section 2*a* as shown in FIG. 2. To be more specific, one main surface 4*b* of the piezoelectric vibration element 3 is pasted to the first elastic plate section 2*a*.

When the piezoelectric vibration element 3 expands or contracts, a warp is generated in the first elastic plate section 2*a*. With this, the first elastic plate section 2*a* vibrates while repeating alternately a state of a leading end portion of the first elastic plate section 2*a* being displaced downward and a state of the leading end portion thereof being displaced upward in FIG. 2.

As shown in FIGS. 2 and 3, a circuit board 9 as a circuit section is fixed to an inner surface of the second elastic plate section 2*b*. In other words, the circuit board 9 is fixed to a surface of the second elastic plate section 2*b* on a side opposing the first elastic plate section 2*a*. This fixing can be carried out by using an appropriate adhesive agent, an appropriate adhesive sheet, or the like.

The circuit board 9 is constituted with an appropriate board material formed of such as a glass epoxy board, a polyimide synthesis resin, or the like. At least part of a driving circuit to supply power to and drive the piezoelectric vibration element 3 is formed in the circuit board 9. As shown in FIG. 2, the circuit board 9 is electrically connected to the piezoelectric vibration element 3 with first and second lead wires 11 and 12. Although not clearly illustrated in FIG. 2, end portions of the first and second lead wires 11 and 12 are electrically connected to the outer electrodes 7 and 8 shown in FIG. 4, respectively. As a connection method therefor, a conductive adhesive, solder, or the like can be used. In particular, in the case of using solder, it is advisable that a reinforcement material formed of resin be applied to the periphery of a solder-connected portion.

The circuit section is not limited to a circuit board. It is sufficient that the circuit section forms at least part of a circuit for driving the piezoelectric vibration device 3. For example, the circuit section may be formed of a wiring element or the like.

In the vibration device 1 of the present embodiment, the piezoelectric vibration element 3 is provided on a surface of the first elastic plate section 2*a* on the second elastic plate section 2*b* side. Meanwhile, the circuit board 9 is provided on a surface of the second elastic plate section 2*b* on the first elastic plate section 2*a* side. In other words, the piezoelectric vibration element 3 and the circuit board 9 are arranged in a region sandwiched between the first elastic plate section 2*a* and the second elastic plate section 2*b*. This makes it possible to miniaturize and particularly thin the vibration device 1.

In addition, a length of an electrically-connected portion by the first and second lead wires 11 and 12 can be shortened. Further, such an electrically-connected structure can be simplified.

A mass addition member 13 is fixed to the leading end portion of the first elastic plate section 2*a*. A resonant frequency of the vibration device 1 can be adjusted by the mass addition member 13. Adding the mass addition member 13 increases a leading end mass of a pendulum formed of the elastic plate 2 and makes the vibration of the vibration device 1 be larger. The mass addition member 13 is formed of an appropriate metal, a combined material of metal and resin, ceramics, or the like. It is preferable for the mass addition member 13 to be formed of a high-density metal such as tungsten or the like because of its large effect of mass addition.

The mass addition member 13 has a first main surface 13A positioned on the first elastic plate section 2*a* side, and a second main surface 13B positioned on the second elastic plate section 2*b* side. A slanted surface portion 13*a* is provided on the second main surface 13B. The slanted surface portion 13*a* is provided so that a thickness of the mass addition member 13 (a distance between the first main surface 13A of the mass addition member 13 and the second main surface 13B thereof) becomes smaller as a distance from the leading end portion of the first elastic plate section 2*a* is larger. The slanted surface portion 13*a* may be arranged on the first main surface 13A of the mass addition member 13.

The first main surface 13A of the mass addition member 13 is formed in a stair-like shape. More specifically, the first main surface 13A has a first planar surface portion 13*b*, a second planar surface portion 13*c*, and a third planar surface portion 13*d* that are connected through steps. A height of a step between the first planar surface portion 13*b* and the second planar surface portion 13*c* is equivalent to a thickness of the first elastic plate section 2*a*. As shown in FIG. 2, the leading end portion of the first elastic plate section 2*a* is provided on the second planar surface portion 13*c*. More specifically, the leading end portion of the first elastic plate section 2*a* makes contact with the step, and the vicinity of the leading end portion thereof is placed on the second planar surface portion 13*c*. As such, an outer surface of the first elastic plate section 2*a*, that is, a surface thereof not opposing the second elastic plate section 2*b* is flush with the first planar surface portion 13*b*.

The second planar surface portion 13*c* and the third planar surface portion 13*d* are also connected through another step. A height of this "another step" is equal to or greater than a thickness of the piezoelectric vibration element 3. A leading end portion of the piezoelectric vibration member 3 is arranged near the stated step.

Figure 6:
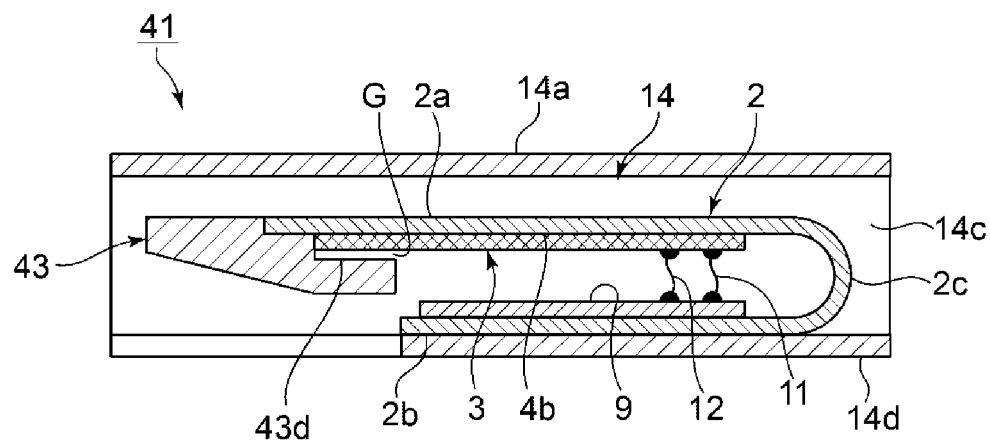
FIG. 6 is a cross-sectional side view of a vibration device according to a variation on the first embodiment of the present invention.

Like a vibration device 41 according to a variation as shown in FIG. 6, the piezoelectric vibration element 3 may be arranged separate from a planar surface portion 43*d* of a mass addition member 43 with a gap G interposed therebetween. In this case, vibrations of the piezoelectric vibration element 3 are unlikely to be disturbed by the mass addition member 43.

However, as shown in FIG. 2, a surface of the piezoelectric vibration element 3 on the opposite side to the one main surface 4*b* may be in contact with or fixed to the third planar surface portion 13*d*.

In the mass addition member 13, the first planar surface portion 13*b* and the second planar surface portion 13*c* are connected through a step, and the second planar surface portion 13*c* and the third planar surface portion 13*d* are connected through another step. Accordingly, the thicknesses of the first elastic plate section 2*a*, the piezoelectric vibration element 3, and so on are within a total dimension of the heights of the step and the "another" step. As such, the mass addition member 13 can be fixed to the leading end portion of the first elastic plate section 2*a* without increasing the size of the device.

As shown in FIG. 1, the vibration device 1 includes a package member 14 as a cover member. The package member 14 is made of an appropriate metal or synthetic resin. A metal is preferable because it is excellent in mechanical strength. Stainless steel is more preferable because it exhibits excellent rust resistivity.

The package member 14 includes a top plate portion 14*a*, and first and second side surface portions 14*b* and 14*c*; one end of each of the first and second side surface portions 14*b* and 14*c* is continuously connected to the top plate portion 14*a*.

Figure 7:
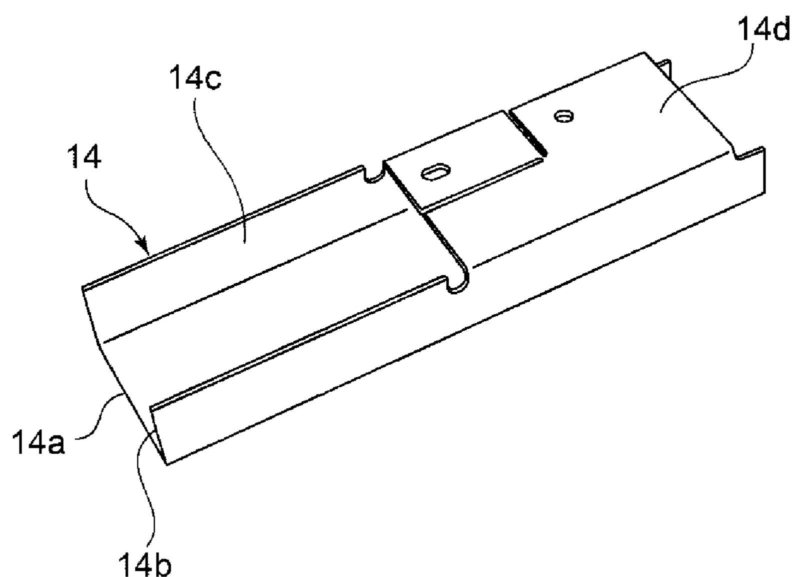
FIG. 7 is a perspective view of a package member, when viewed from a bottom surface side thereof, that is used in the first embodiment of the present invention.

FIG. 7 is a perspective view illustrating the package member 14 when viewed from a bottom surface side thereof. The other end of the first side surface portion 14*b* and the other end of the second side surface portion 14*c* are continuously connected through a bottom plate portion 14*d*. Here, a direction in which the first and second elastic plate sections 2*a* and 2*b* extend from the curvature joining section 2*c*, as shown in FIG. 2, is taken as a lengthwise direction. The bottom plate portion 14*d* is provided from the center of the package member 14 toward only one side thereof in the lengthwise direction. The bottom plate portion 14*d* corresponds to a portion to which the second elastic plate section 2*b* is fixed.

Figure 8:
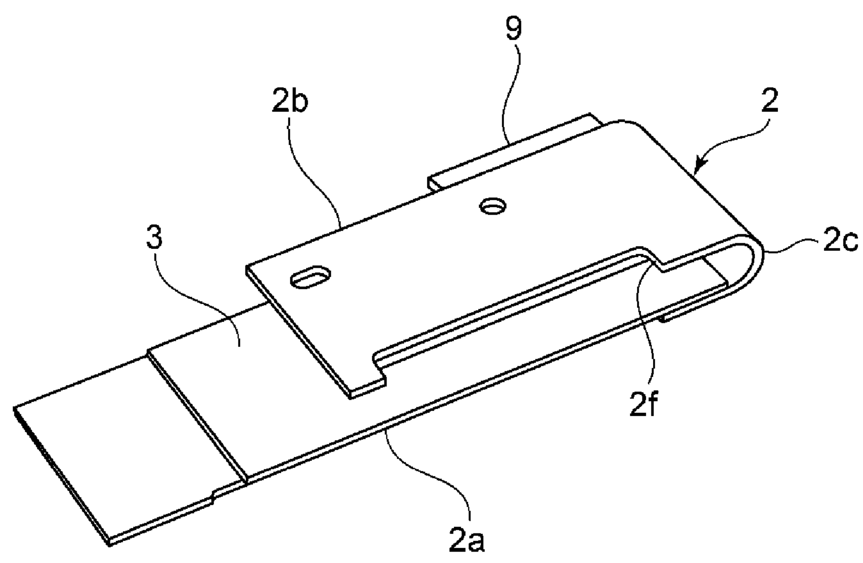
FIG. 8 is a perspective view illustrating a state where a piezoelectric vibration element and a circuit board are attached to an elastic plate, when seen from the bottom surface side, in the vibration device according to the first embodiment of the present invention.

FIG. 8 illustrates a major portion of the elastic plate that is inserted into the package member 14 in a state shown in FIG. 7. The circuit board 9 is fixed onto a surface of the second elastic plate section 2*b* on the first elastic plate section 2*a* side. Meanwhile, the piezoelectric vibration element 3 is fixed onto a surface of the first elastic plate section 2*a* on the second elastic plate section 2*b* side. It is to be noted that the outer electrodes 7 and 8 of the piezoelectric vibration element 3 are not illustrated in FIG. 8. Further, as shown in FIG. 8, a cutout 2*f* is provided on a side edge of the second elastic plate section 2*b* on one side thereof.

As shown in FIG. 3, a cutout 2*g* is also provided on a side edge of the first elastic plate section 2*a* on one side thereof. The cutout 2*g* is so provided as to prevent the first and second outer electrodes 7 and 8 of the piezoelectric vibration element 3 from making contact with the first elastic plate section 2*a* made of metal.

The second elastic plate section 2*b* is inserted, while maintaining its orientation shown in FIG. 8, into the package member 14 having the orientation as shown in FIG. 7. In reality, a structure in which the piezoelectric vibration element 3 and the mass addition member 13 are fixed to the elastic plate 2 is installed inside the package member 14.

When an AC electric field is applied to the piezoelectric vibration element 3 from the exterior through the circuit board 9, the piezoelectric vibration element 3 expands/contracts. As a result, the first elastic plate section 2*a* vibrates in a manner in which the leading end portion of the first elastic plate section 2*a* is displaced in an up-down direction in FIG. 2. Because the mass addition member 13 is provided, a sufficient vibration strength can be obtained and the overall vibration device 1 enclosed by the package member 14 vibrates, whereby the device operates as a vibrator.

As discussed above, the vibration device 1 can be miniaturized and particularly be thinned.

Further, it is preferable that an inner surface of the top plate portion 14*a* of the package member 14 act as a stopper that defines a termination point of displacement of the leading end portion of the mass addition member 13 toward the package member 14 side when the elastic plate 2 vibrates. In other words, in a case where an impact of dropping or the like of the device, an impact from the exterior, or the like is applied, there is a risk that the leading end portion of the first elastic plate section 2*a* of the elastic plate 2 is significantly displaced upward in FIG. 2. In the case where this displacement is excessively large, there is a risk that a portion of ceramics in the piezoelectric vibration element 3 is cracked or chipped. In contrast, in the present embodiment, in the case where the elastic plate 2 excessively vibrates, the leading end portion of the mass addition member 13 makes contact with the inner surface of the top plate portion 14*a* of the package member 14, which prevents the first elastic plate section 2*a* from being further displaced toward the top plate portion 14*a* side. In other words, the inner surface of the top plate portion 14*a* acts as the above-mentioned stopper. With this, the ceramics is unlikely to be cracked or chipped in the piezoelectric vibration element 3.

Further, because a laminated-type piezoelectric vibration element is used as the piezoelectric vibration element 3, sufficiently strong vibrations can be obtained even if the device is made to be smaller in size. Note that, however, in the present invention, the piezoelectric vibration element is not limited to a laminated-type piezoelectric vibration element. Various types of piezoelectric vibration elements can be used.

Figure 9:
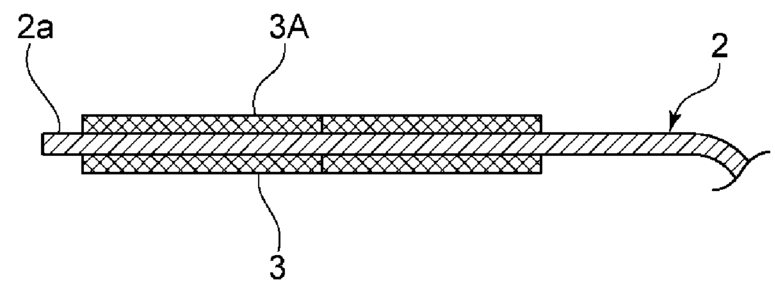
FIG. 9 is a partial cut-out cross-sectional side view for explaining a first elastic plate section and piezoelectric vibration elements provided on both sides of the first elastic plate section according to a variation on the first embodiment of the present invention.

In the above embodiment, although the piezoelectric vibration element 3 is provided only on the inner surface of the first elastic plate section 2*a*, a piezoelectric vibration element 3A may be further provided on an outer side portion of the first elastic plate section 2*a* as shown in FIG. 9, and bimorph driving may be carried out. However, in order for the device to be thinned, it is preferable that the piezoelectric vibration element 3 be provided only on the surface of the first elastic plate section 2*a* opposing the second elastic vibration section 2*b* side as in the above embodiment.

Figure 10A:
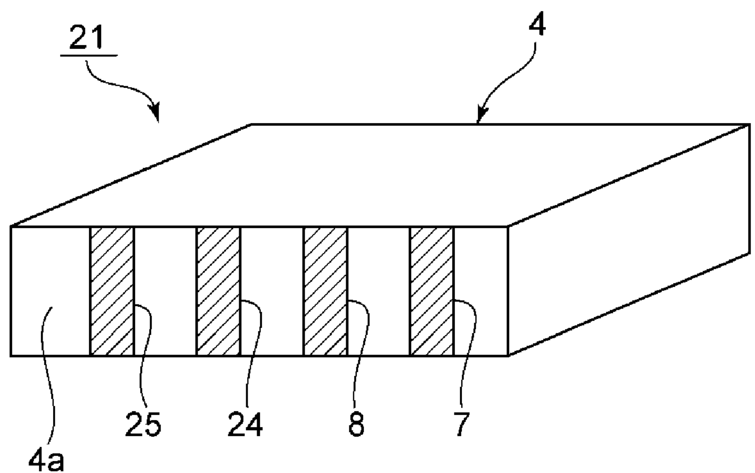
FIG. 10(*a*) is a perspective view illustrating an external appearance of a laminated-type piezoelectric vibration element used in another variation on the first embodiment of the present invention, and FIG. 10(*b*) is a cross-sectional front view of the stated laminated-type piezoelectric vibration element.
Figure 10B:
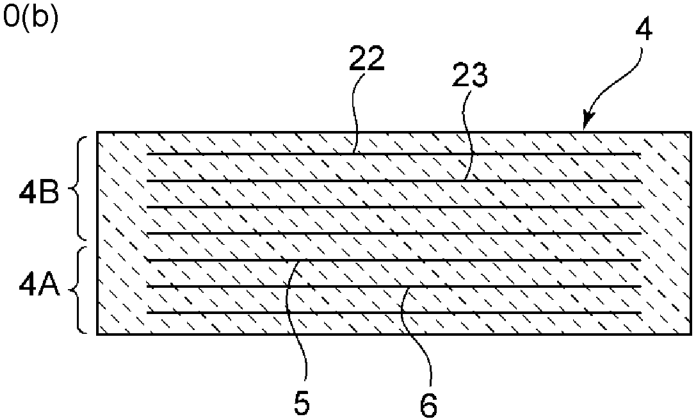

In place of the laminated-type piezoelectric vibration element 3, a laminated-type piezoelectric vibration element 21 shown in FIGS. 10(*a*) and 10(*b*) may be used. In the piezoelectric vibration element 21, inside the ceramic multilayer body 4 formed of piezoelectric ceramics, a feed-back portion 4B is laminated on a driving portion 4A in which the plurality of first inner electrodes 5 and the plurality of second inner electrodes 6 are laminated. In the feed-back portion 4B, a plurality of third inner electrodes 22 and a plurality fourth inner electrodes 23 are laminated with the ceramics interposed therebetween. Like the first and second inner electrodes 5 and 6, the third and fourth inner electrodes 22 and 23 are extended to the side surface 4*a* of the ceramic multilayer body 4. On the side surface 4*a*, third and fourth outer electrodes 24 and 25, in addition to the first and second outer electrodes 7 and 8, are provided. The third and fourth outer electrodes 24 and 25 are electrically connected to the third and fourth inner electrodes 22 and 23, respectively. In the piezoelectric vibration element 21, self-excited driving can be carried out because the third and fourth inner electrodes 22 and 23 as feed-back electrodes are provided.

Figure 11:
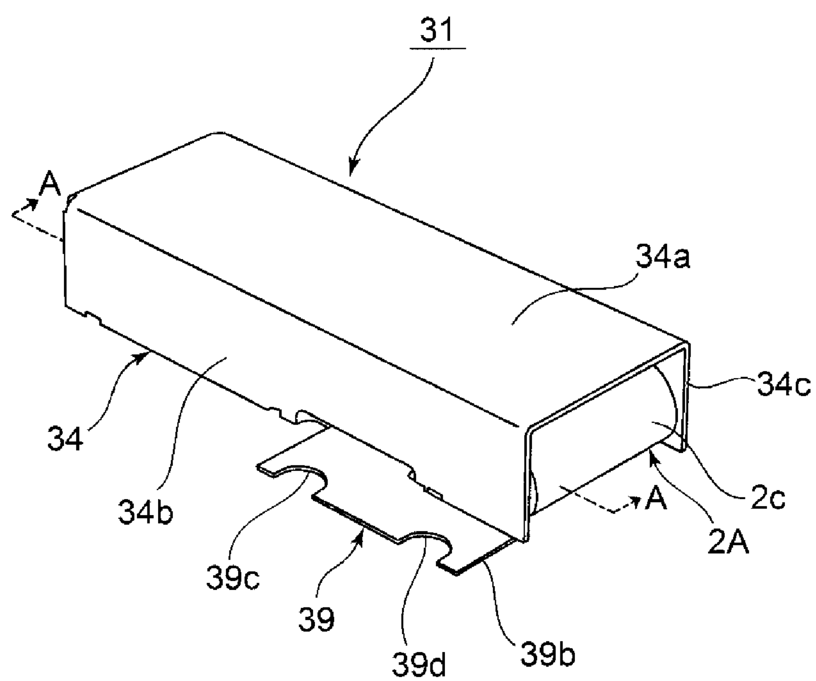
FIG. 11 is a perspective view illustrating an external appearance of a vibration device according to a second embodiment of the present invention.
Figure 12:
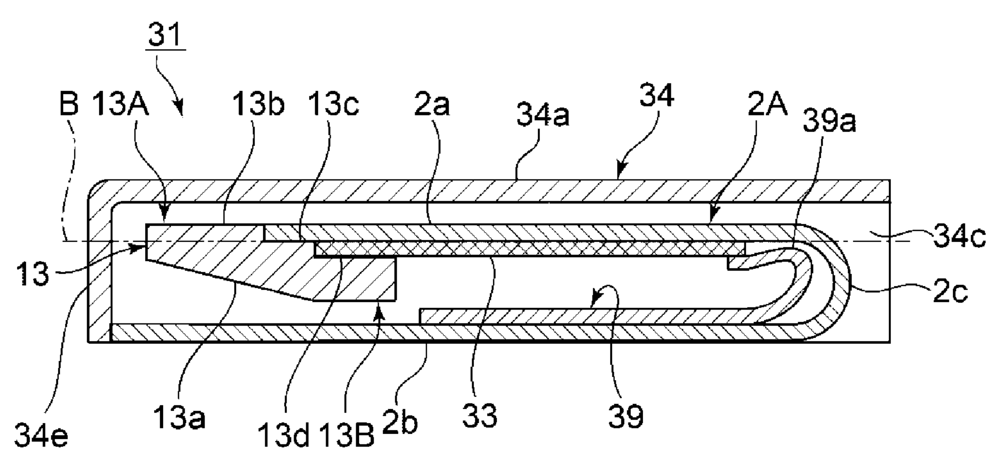
FIG. 12 is a cross-sectional view of the vibration device taken along an A-A line in FIG. 11.
Figure 13A:
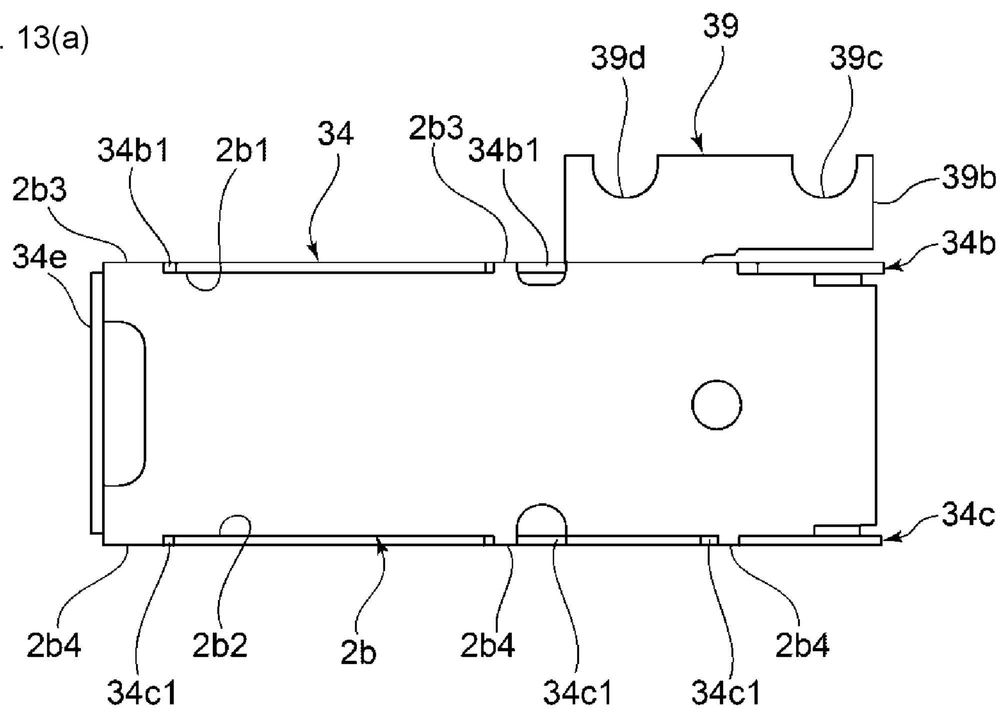
FIG. 13(*a*) is a bottom view of the vibration device according to the second embodiment of the present invention, and FIG. 13(*b*) is a perspective view illustrating the stated vibration device upside down.
Figure 13B:
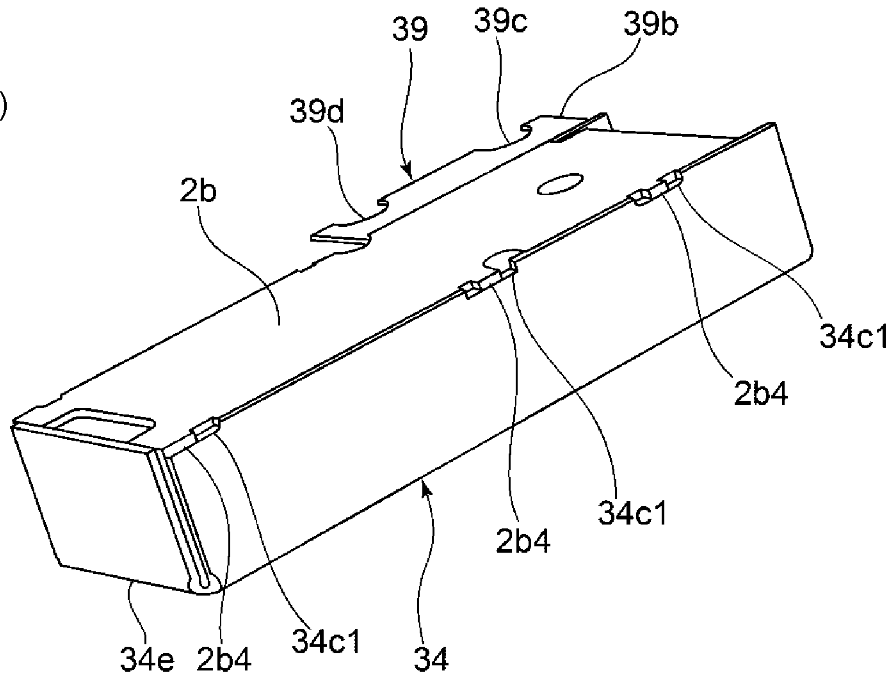

FIG. 11 is a perspective view illustrating an external appearance of a vibration device 31 according to a second embodiment of the present invention. FIG. 12 is a cross-sectional view of the vibration device 31 taken along an A-A line in FIG. 11. FIG. 13(*a*) is a bottom view of the stated vibration device, and FIG. 13(*b*) is a perspective view illustrating the stated vibration device upside down.

Figure 14:
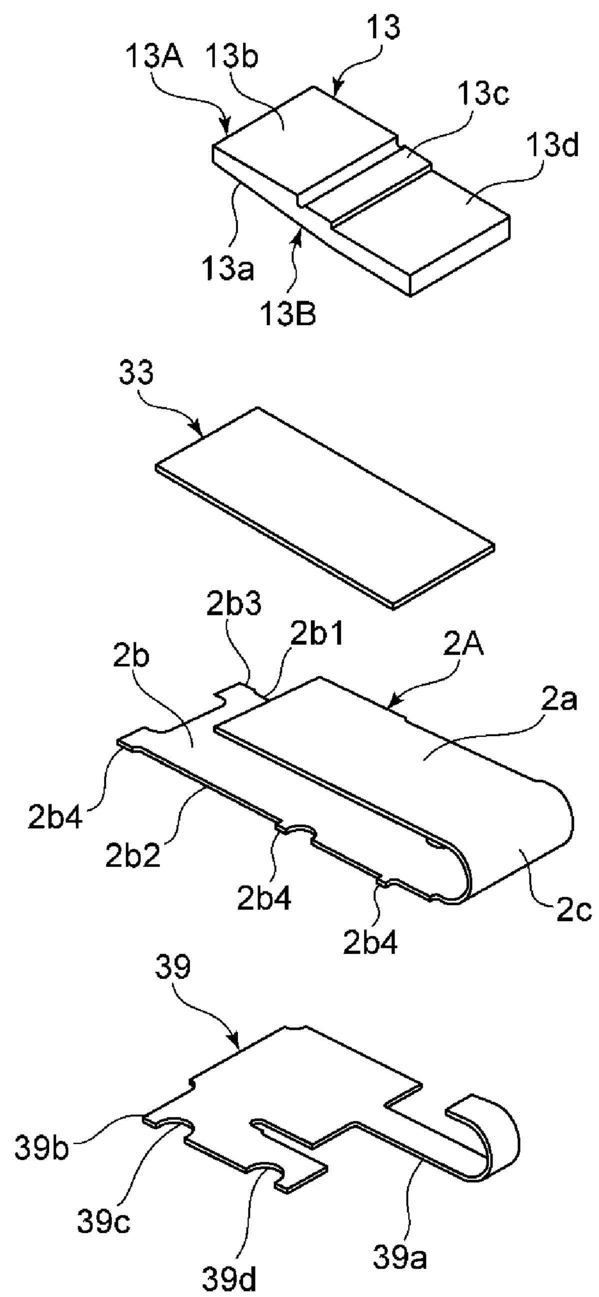
FIG. 14 is an exploded perspective view for explaining constituent elements, excluding a package member, of the vibration device according to the second embodiment of the present invention.

Further, FIG. 14 is an exploded perspective view for explaining constituent elements, excluding a package member, of the vibration device in the second embodiment.

As shown in FIG. 11 through FIG. 13, the vibration device 31 includes a package member 34. The vibration device 31 of the present embodiment differs from the vibration device 1 of the first embodiment in that a shape of the package member 34 and a shape of an elastic plate 2A to be explained later are different from those of the corresponding constituent elements in the first embodiment. Hereinafter, description in the first embodiment will be cited as needed by assigning identical reference signs to the same constituent elements as those in the first embodiment.

In the elastic plate 2A, a direction in which the first and second elastic plate sections 2*a* and 2*b* extend from the curvature joining section 2*c* is taken as a lengthwise direction. The package member 34 includes a top plate portion 34*a*. The top plate portion 34*a* is formed in a rectangular planar shape and is extended in the lengthwise direction. First and second side surface portions 34*b* and 34*c* are continuously connected to the top plate portion 34*a*. To be more specific, the first and second side surface portions 34*b* and 34*c* are provided so as to respectively extend downward from first and second side edges of the top plate portion 34*a* extending in the length wise direction. In other words, the first and second side surface portions 34*b* and 34*c* extend from the top plate portion 34*a* toward the second elastic plate section 2*b*.

The package member 34 further includes a locking wall 34*e* whose one end is continuously connected to the top plate portion 34*a*. More specifically, the top plate portion 34*a* has an edge positioned on the mass addition member 13 side in the lengthwise direction relative to the curvature joining section 2*c* side. The locking wall 34*e* is so provided as to extend toward the second elastic plate section 2*b* from the stated edge.

The package member 34 is made of an appropriate rigid material such as a metal plate, a synthetic resin, or the like. In the present embodiment, the package member 34 is made of a metal because of its excellence in mechanical strength. The package member 34 can be easily obtained by bending a metal plate.

In the vibration device 31, the package member 34 does not have a bottom plate portion. The second elastic plate section 2*b* is fixed to the first and second side surface portions 34*b* and 34*c* of the package member 34 instead. In other words, the second elastic plate section 2*b* constitutes the bottom plate portion of the vibration device 31.

Although the fixing method is not limited to any specific one, the second elastic plate section 2*b* is bonded to the package member 34 by welding in the present embodiment. This bonding structure will be described later in detail.

Here, a direction in which the first elastic plate section 2*a* and the second elastic plate section 2*b* oppose each other is taken as a thickness direction. As shown in FIG. 12, an axis that extends in the lengthwise direction and passes through the center in the thickness direction between a surface of the first elastic plate section 2*a* on the opposite side to the second elastic plate section 2*b* side and a surface of a piezoelectric vibration element 33 on the second elastic plate section 2*b* side, is taken as a central axis B. At this time, in the present embodiment, the center of gravity of the mass addition member 13 is positioned on the second elastic plate section 2*b* side relative to the central axis B.

As shown in FIG. 12, a dimension of the second elastic plate section 2*b* in the lengthwise direction is longer than a dimension of the first elastic plate section 2*a* in the lengthwise direction. In this case, the first elastic plate section 2*a* and the mass addition member 13 can be surely protected by the second elastic plate section 2*b*. In other words, the second elastic plate section 2*b* can sufficiently function as a bottom plate portion of the package.

In the vibration device 31, since the package member 34 does not have a bottom plate portion, the vibration device 31 can be further thinned than the vibration device 1.

In the vibration device 31, the second elastic plate section 2*b* extends in the lengthwise direction to a position opposing the mass addition member 13. Accordingly, even if the mass addition member 13 that is fixed to the leading end portion of the first elastic plate section 2*a* is excessively displaced downward at the time of vibrations, the mass addition member 13 bumps against the second elastic plate section 2*b*, thereby making it possible to define a termination point of the displacement of the mass addition member 13. In other words, the second elastic plate section 2*b* acts as a stopper to regulate excessive displacement. Accordingly, a flexure of the first elastic plate section 2*a* caused by excessive displacement can be suppressed. As such, breakage of the piezoelectric vibration element 33 is unlikely to occur. In particular, in the case where the piezoelectric vibration element 33 is formed of piezoelectric ceramics, breakage of the ceramics can be effectively suppressed.

Figure 16A:
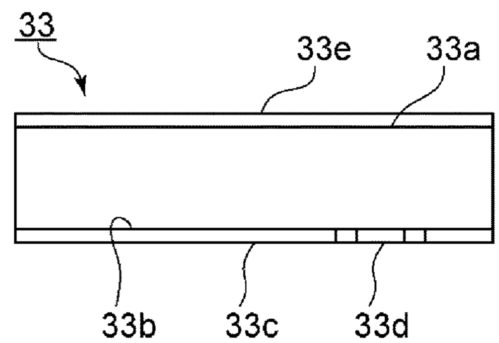
FIG. 16(*a*) and FIG. 16(*b*) are a front view and a bottom view, respectively, of a piezoelectric vibration element used in the second embodiment.
Figure 16B:
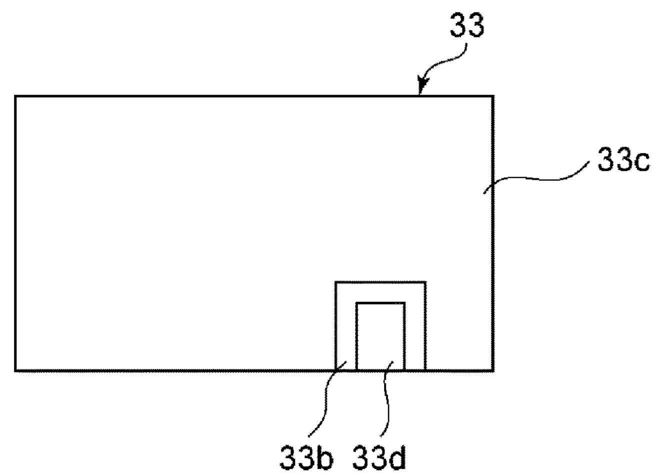

In the vibration device 31 as well, the piezoelectric vibration element 33 is fixed to the lower surface of the first elastic plate section 2*a*. As shown in FIGS. 16(*a*) and 16(*b*), the piezoelectric vibration element 33 includes a first main surface 33*a* and a second main surface 33*b* opposing the first main surface 33*a*. The piezoelectric vibration element 33 is fixed to the first elastic plate section 2*a* with the first main surface 33*a* side.

In the present embodiment, as shown in FIG. 12, the package member 34 includes the locking wall 34*e*. A distance between the locking wall 34*e* and the mass addition member 13 is a distance such that the mass addition member 13 makes contact with the locking wall 34*e* in the case where an impact is applied to the locking wall 34*e*. As such, in the case where the device bumps against the ground or the like from the mass addition member 13 side, the mass addition member 13 makes contact with the locking wall 34*e*. Because of this, the displacement of the first elastic plate section 2*a* is suppressed so that a warp is unlikely to be generated in the first elastic plate section 2*a*. Accordingly, tensile stress is unlikely to be applied to the piezoelectric vibration element 33. This makes it difficult for a crack to be generated in the piezoelectric vibration element 33.

Meanwhile, the center of gravity of the mass addition member 13 is positioned on the second elastic plate section 2*b* side relative to the central axis B. As such, in the case where the device bumps against the ground or the like from the curvature joining section 2*c* side, the first elastic plate section 2*a* is likely to be displaced so that the mass addition member 13 approaches the second elastic plate section 2*b* side. With this, a central portion of the first elastic plate section 2*a* in the lengthwise direction is likely to be warped so as to approach the top plate portion 34*a* of the package member 34. Accordingly, not a tensile stress but a compression stress is applied to the piezoelectric vibration element 33. This makes it difficult for a crack to be generated in the piezoelectric vibration element 33 using ceramics.

In the present embodiment, the locking wall 34*e* is fixed to the second elastic plate section 2*b*. Note that it is sufficient for the locking wall 34*e* to be connected to a portion constituting the bottom plate portion of the vibration device, not to be connected to the second elastic plate section 2*b*. For example, in the case where the package member has a bottom surface portion, the locking wall may be fixed to the bottom surface portion of the package member. In this case, it is sufficient that part of the bottom surface portion of the package member is positioned so as to overlap with an edge of the top plate portion on the mass addition member side in plan view from the top plate portion side.

Alternatively, it is sufficient even if the locking wall does not extend so as to reach the surface of the second elastic plate section on the first elastic plate section side, and is not fixed to a portion constituting the bottom surface portion of the vibration device. Also in this case, the displacement of the first elastic plate section can be suppressed by the locking wall. Note that, however, it is more preferable for the locking wall to be fixed to the bottom surface portion of the vibration device, so as to more surely suppress the displacement of the first elastic plate section.

As shown in FIG. 16(*b*), a first electrode 33*c* and a second electrode 33*d* are provided on the second main surface 33*b* of the piezoelectric vibration element 33. The first electrode 33*c* is so provided as to excite the piezoelectric vibration element 33. As shown in FIG. 16(*a*), another electrode, that is, a vibration electrode 33*e* is provided on the first main surface 33*a* side so as to oppose the first electrode 33*c* with the piezoelectric body layer interposed therebetween. The vibration electrode 33*e* is electrically connected to the second electrode 33*d* through a via hole electrode or a connection electrode passing through a side surface of the piezoelectric body (not shown).

Figure 15:
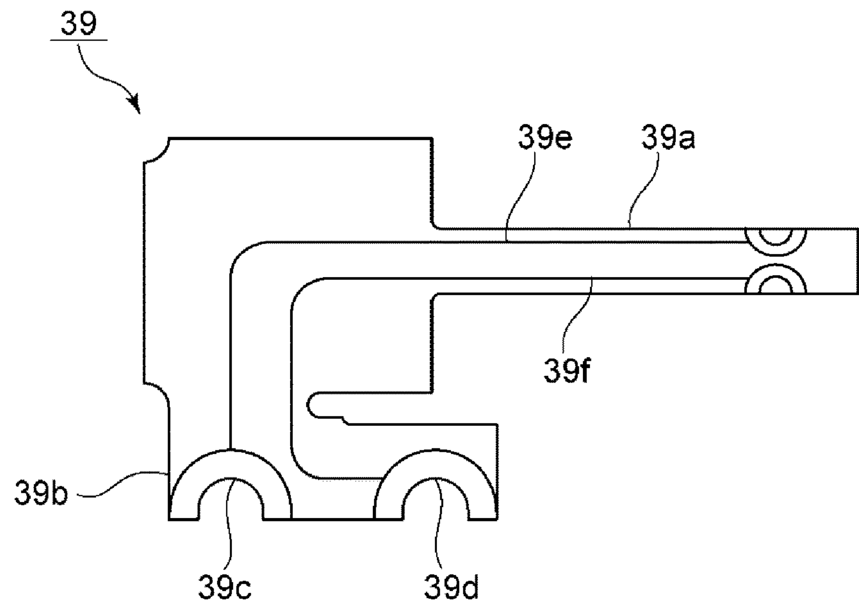
FIG. 15 is a plan view of a flexible printed circuit board used in the second embodiment of the present invention.

The first electrode 33*c* and the second electrode 33*d* are electrically connected to a flexible printed circuit board 39 shown in FIG. 12 so as to drive the piezoelectric vibration element 33. In the present embodiment, the flexible printed circuit board 39 is provided in place of the circuit board 9 of the first embodiment. FIG. 15 is a plan view of the flexible printed circuit board 39. As shown in FIG. 15, an electric connection portion 39*a* is integrally provided with the flexible printed circuit board 39.

The flexible printed circuit board 39 is fixed to the second elastic plate section 2*b*. The electric connection portion 39*a* extends to reach the first elastic plate section 2*a* side through the second elastic plate section 2*b* and an inner side portion of the curvature joining section 2*c*. At the first elastic plate section 2*a* side, first and second wirings 39*e*, 39*f* provided in the electric connection portion 39*a*, as shown in FIG. 15, are electrically connected to the first electrode 33*c* and the second electrode 33*d*, respectively, of the piezoelectric vibration element 33.

The flexible printed circuit board 39 and the electric connection portion 39*a* are, for example, constituted by using a flexible film of resin such as thermosetting polyimide or the like. Accordingly, processing of electric connection with the piezoelectric vibration element 33 can be carried out with ease.

As shown in FIG. 15, the flexible printed circuit board 39 includes a laterally-extended portion 39*b* sticking out to a lateral side relative to the second elastic plate section 2*b*. Cutouts 39*c* and 39*d* are provided in the laterally-extended portion 39*b*. A portion along the cutouts 39*c* and 39*d* is an electrically-connected portion with the exterior. Because the electrically-connected portion with the exterior sticks out to a lateral side from the package member 34 and the second elastic plate section 2*b*, electric connection with the exterior can be made with ease.

In the present embodiment as well, the piezoelectric vibration element 33 and the flexible printed circuit board 39 as a circuit board are provided on inner side portion surfaces of the first elastic plate section 2*a* and the second elastic plate section 2*b*, respectively. As such, the vibration device 31, like the vibration device 1, can be miniaturized and particularly be thinned. Further, as discussed before, in the vibration device 31, the package member 34 does not have a bottom plate portion, whereby the vibration device 31 can be further thinned than the vibration device 1.

At the time of manufacturing the vibration device 31, constituent elements shown in FIG. 14 are assembled. In other words, the constituent elements excluding the package member 34 are assembled. Subsequently, the package member 34 and the second elastic plate section 2*b* are bonded. More specifically, the first and second side surface portions 34*b*, 34*c* and the locking wall 34*e* are connected to the second elastic plate section 2*b*. Accordingly, the manufacture process thereof can be further simplified than that of the vibration device 1.

At the time of the bonding, welding or an appropriate bonding method using a bonding agent such as a brazing filler metal or the like can be used. It is preferable that a welding method be used because of easiness in manufacturing and excellence in bonding strength. Details of the bonding portions will be described below.

As shown in FIG. 13(*a*), in the vibration device 31, a plurality of cutouts 34*b*1 and a plurality of cutouts 34*c*1 are respectively provided in a lower end surface in FIG. 12 of the first and second side surface portions 34*b* and 34*c* of the package member 34.

Meanwhile, the second elastic plate 2*b* includes first and second side edges 2*b*1 and 2*b*2. The first and second side edges 2*b*1 and 2*b*2 extend in the lengthwise direction. On the first and second side edges 2*b*1 and 2*b*2, there are respectively provided a plurality of projecting portions 2*b*3 and a plurality of projecting portions 2*b*4 of the second elastic plate section 2*b* in a direction parallel to a surface of the second elastic plate section 2*b* on the first elastic plate section 2*a* side and orthogonal to the lengthwise direction. The projecting portions 2*b*3 and 2*b*4 enter into the cutouts 34*b*1 and 34*c*1 provided in the first and second side surface portions 34*b* and 34*c*.

By using the cutouts 34*b*1 and 34*c*1 and the projecting portions 2*b*3 and 2*b*4, positioning can be easily carried out at the time of the bonding. Here, a direction perpendicular to the lengthwise direction and the thickness direction is taken as a width direction. At this time, positioning of the second elastic plate section 2*b* and the package member 34 in both the lengthwise direction and the width direction can be carried out with ease.

The side edges 2*b*1 and 2*b*2 of the second elastic plate section 2*b* make contact with inner side portion surfaces of the first and second side surface portions 34*b* and 34*c* of the package member 34. Accordingly, at the time of welding, it is sufficient to weld the side surface continuously connected to the side edge of the second elastic plate section 2*b* to the inner side portion surface of the first side surface portion 34*b* or the second side surface portion 34*c*. With this, the bonding strength can be sufficiently raised. Further, the projecting portions provided in the second elastic plate section 2*b* and the side surface portions facing the cutouts 34*b*1 and 34*c*1 may be welded. This makes it possible to further raise the bonding strength.

Moreover, the leading end portion of the second elastic plate section 2*b* makes contact with the inner side portion surface of the package member 34. As such, at the time of welding, it is sufficient to weld the side surface continuously connected to the leading end portion of the second elastic plate section 2*b* to the inner side portion surface of the locking wall 34*e*. This makes it possible to further raise the bonding strength. Accordingly, the displacement of the first elastic plate section can be suppressed with certainty by the locking wall 34*e*. As such, a crack is more unlikely to be generated in the piezoelectric vibration element.

A surface of the second elastic plate section 2*b* on the first elastic plate section side may be in contact with a lower end portion of the locking wall 34*e* in FIG. 12. In this case, it is sufficient to weld the above-mentioned surface of the second elastic plate section 2*b* to the above-mentioned end portion of the locking wall 34*e*.

It is preferable that the above welding be carried out by laser beam radiation or the like. With this, the welding can be easily carried out. In particular, in the case where the side surface portions continuously connected to the side edges of the second elastic plate section 2*b* are welded to the first and second side surface portions 34*b* and 34*c* of the package member 34, this method is preferable because the diameter of a radiated laser beam can be made large.

Other constituent elements of the vibration device 31 than those discussed above are the same as in the vibration device 1 of the first embodiment.

In the vibration device 31 as well, the circuit board 9 used in the first embodiment may be used as a circuit board in place of the flexible printed circuit board 39. Further, instead of the piezoelectric vibration element 33, various types of piezoelectric vibration elements cited in the description of the first embodiment may be used. As for other configurations, constituent elements capable of being replaced between the first and second embodiments may be appropriately replaced or combined.

REFERENCE SIGNS LIST

1 VIBRATION DEVICE
2, 2A ELASTIC PLATE
2*a* FIRST ELASTIC PLATE SECTION
2*b* SECOND ELASTIC PLATE SECTION
2*b*1, 2*b*2 FIRST SIDE EDGE, SECOND SIDE EDGE
2*b*3, 2*b*4 PROJECTING PORTION
2*c* CURVATURE JOINING SECTION
2*f*, 2*g* CUTOUT
3, 3A PIEZOELECTRIC VIBRATION ELEMENT
4 CERAMIC MULTILAYER BODY
4A DRIVING PORTION
4B FEED-BACK PORTION
4*a* SIDE SURFACE
4*b* MAIN SURFACE
5, 6 FIRST INNER ELECTRODE, SECOND INNER ELECTRODE
5*a*, 6*a* EXTENDED PORTION
7, 8 FIRST OUTER ELECTRODE, SECOND OUTER ELECTRODE
9 CIRCUIT BOARD
11, 12 FIRST LEAD WIRE, SECOND LEAD WIRE
13 MASS ADDITION MEMBER
13*a* SLANTED SURFACE PORTION
13*b* FIRST PLANAR SURFACE PORTION
13*c* SECOND PLANAR SURFACE PORTION
13*d* THIRD PLANAR SURFACE PORTION
13A, 13B FIRST MAIN SURFACE, SECOND MAIN SURFACE
14 PACKAGE MEMBER
14*a* TOP PLATE PORTION
14*b*, 14*c* FIRST SIDE SURFACE PORTION, SECOND SIDE SURFACE PORTION
14*d* BOTTOM PLATE PORTION
21 PIEZOELECTRIC VIBRATION ELEMENT
22, 23 THIRD INNER ELECTRODE, FOURTH INNER ELECTRODE
24, 25 THIRD OUTER ELECTRODE, FOURTH OUTER ELECTRODE
31 VIBRATION DEVICE
33 PIEZOELECTRIC VIBRATION ELEMENT
33*a*, 33*b* FIRST MAIN SURFACE, SECOND MAIN SURFACE
33*c*, 33*d* FIRST ELECTRODE, SECOND ELECTRODE
33*e* VIBRATION ELECTRODE
34 PACKAGE MEMBER
34*a* TOP PLATE PORTION
34*b*, 34*c* FIRST SIDE SURFACE PORTION, SECOND SIDE SURFACE PORTION
34*b*1, 34*c*1 CUTOUT
34*e* LOCKING WALL
39 FLEXIBLE PRINTED CIRCUIT BOARD
39*a* ELECTRIC CONNECTION PORTION
39*b* LATERALLY-EXTENDED PORTION
39*c*, 39*d* CUTOUT
39*e*, 39*f* FIRST WIRING, SECOND WIRING
41 VIBRATION DEVICE
43 MASS ADDITION MEMBER
43*d* THIRD PLANAR SURFACE PORTION

The invention claimed is:

1. A vibration device comprising:

an elastic plate including a first elastic plate section having a leading end portion, a second elastic plate section opposed and spaced from the first elastic plate section, and a joining section connecting the first elastic plate section and the second elastic plate section;

a piezoelectric vibration element on the first elastic plate section and between the first elastic plate section and the second elastic plate section;

a circuit that drives the piezoelectric vibration element on the second elastic plate section and between the first elastic plate section and the second elastic plate section;

a mass addition member attached to the leading end portion of the first elastic plate section; and a package accommodating the elastic plate.

2. The vibration device according to claim 1, wherein the mass addition member includes a first main surface on the first elastic plate section and a second main surface having a slanted surface portion positioned proximal to the second elastic plate section so that a thickness of the mass addition member decreases as a distance from the leading end portion of the first elastic plate section increases.

3. The vibration device according to claim 2, wherein the first main surface of the mass addition member has a first planar surface portion and a second planar surface portion that are positioned so as to define a first step between the first planar surface portion and the second planar surface portion, wherein a height of the first step is the same as a thickness of the first elastic plate section, and the leading end portion of the first elastic plate section is provided on the second planar surface portion.

4. The vibration device according to claim 3, wherein the first main surface of the mass addition member further has a third planar surface portion that is positioned so as to define a second step between the second planar surface portion and the third planar surface portion, wherein a height of the second step is equal to or greater than a thickness of the piezoelectric vibration element.

5. The vibration device according to claim 4, wherein the piezoelectric vibration element is spaced from the third planar surface portion such that a gap is interposed between the piezoelectric vibration element and the third planar surface portion.

6. The vibration device according to claim 1, wherein the elastic plate is made of a single metal plate.

7. The vibration device according to claim 1, wherein the package member includes a top plate portion that opposing the first elastic plate section.

8. The vibration device according to claim 7, wherein the top plate portion of the package member covers the first main surface of the mass addition member, and an inner surface of the top plate portion defines a termination point of displacement of a leading end portion of the mass addition member toward the top plate portion when the elastic plate vibrates.

9. The vibration device according to claim 8, wherein, the package member includes a locking wall extending from an edge of the top plate portion toward the second elastic plate section on a side of the package member proximal to the mass addition member.

10. The vibration device according to claim 7,
wherein the package member includes first and second side surface portions extending from first and second side edges of the top plate portion toward the second elastic plate section side,
the second elastic plate section is fixed to the first and second side surface portions, and
the second elastic plate section defines a bottom plate portion of the vibration device.

11. The vibration device according to claim 10, wherein, when a direction in which the first and second elastic plate sections extend from the joining section is defined as a lengthwise direction, a first dimension of the second elastic plate section in the lengthwise direction is greater than a second dimension of the first elastic plate section in the lengthwise direction.

12. The vibration device according to claim 11, wherein the second elastic plate section extends to a position opposing the mass addition member so as to define a termination point of displacement of the mass addition member toward the second elastic plate section when the elastic plate vibrates.

13. The vibration device according to claim 10,
wherein, when a direction in which the first and second elastic plate sections extend from the joining section is defined as the lengthwise direction, and the second elastic plate section includes a projecting portion extending in a direction parallel to a surface of the second elastic plate section and orthogonal to the lengthwise direction,
a lower end surface of each of the first and second side surface portions of the package member define a respective cutout, and
the projecting portion is arranged within each of the respective cutouts.

14. The vibration device according to claim 13, wherein the second elastic plate section is welded to the first and second side surface portions of the package member.

15. The vibration device according to claim 1, wherein, when a first direction in which the first and second elastic plate sections extend from the joining section is defined as a lengthwise direction, a second direction in which the first and second elastic plate sections oppose each other is defined as a thickness direction, and an axis that extends in the lengthwise direction and passes through a center of the thickness direction between is defined as a central axis, the center of gravity of the mass addition member is positioned on a side of the central axis proximal to the second elastic plate section.

16. The vibration device according to claim 1, wherein the piezoelectric vibration element is a laminated piezoelectric vibration element that includes a plurality of electrodes and a piezoelectric body layer interposed between the electrodes.

17. The vibration device according to claim 1, further comprising an electric connection member connecting the piezoelectric vibration element and the circuit.

18. The vibration device according to claim 17, wherein the circuit includes a flexible printed circuit board, the electric connection member is integrated with the flexible printed circuit board, and the electric connection member is extended to the first elastic plate portion along an inner side portion of the joining section and electrically connected to the piezoelectric vibration element.

19. The vibration device according to claim 17, wherein the piezoelectric vibration element includes a first main surface and a second main surface, the piezoelectric vibration element is fixed to the first elastic plate section on the first main surface thereof, first and second electrodes are electrically connected to the second main surface of the piezoelectric vibration element, and the electric connection member is electrically connected to the first and second electrodes.

* * * * *